(12) United States Patent
Balachandran et al.

(10) Patent No.: US 8,314,685 B2
(45) Date of Patent: Nov. 20, 2012

(54) DATA DETECTOR FOR UHF RFID TAGS

(75) Inventors: Ganesh Balachandran, Irving, TX (US); Raymond Barnett, Farmington, MN (US)

(73) Assignee: Texas Instruments Incorporated, Dallas, TX (US)

( * ) Notice: Subject to any disclaimer, the term of this patent is extended or adjusted under 35 U.S.C. 154(b) by 1007 days.

(21) Appl. No.: 11/895,905

(22) Filed: Aug. 27, 2007

(65) Prior Publication Data

US 2009/0058601 A1      Mar. 5, 2009

(51) Int. Cl.
*H04Q 5/22* (2006.01)

(52) U.S. Cl. .......... 340/10.1; 340/10.2; 340/10.3; 340/10.31; 340/10.32; 340/10.33; 340/10.4; 340/10.42; 340/10.5; 340/10.51; 340/10.52; 340/10.6; 235/375; 235/376; 235/377; 235/378; 235/379; 235/380; 235/381; 235/382; 235/382.5; 235/383; 235/384; 235/385

(58) Field of Classification Search ........ 340/10.1–10.6, 340/572.1–572.9; 235/375–385
See application file for complete search history.

(56) References Cited

U.S. PATENT DOCUMENTS

| | | | | |
|---|---|---|---|---|
| 3,487,561 A * | 1/1970 | Azure, Jr. et al. | ............. | 434/355 |
| 3,624,475 A * | 11/1971 | Smith | ............. | 388/811 |
| 3,662,290 A * | 5/1972 | Elliott | ............. | 332/162 |
| 3,902,123 A * | 8/1975 | Oomen | ............. | 455/221 |
| 4,541,043 A * | 9/1985 | Ballegeer et al. | ............. | 710/242 |
| 4,676,660 A * | 6/1987 | King et al. | ............. | 368/113 |
| 5,130,578 A * | 7/1992 | Stone et al. | ............. | 341/123 |
| 5,297,173 A * | 3/1994 | Hikmet et al. | ............. | 375/371 |
| 5,408,197 A * | 4/1995 | Miyake | ............. | 330/129 |
| 5,473,571 A * | 12/1995 | Shigematsu et al. | ............. | 365/227 |
| 5,617,451 A * | 4/1997 | Mimura et al. | ............. | 375/340 |
| 5,666,167 A * | 9/1997 | Tults | ............. | 348/465 |
| 5,945,850 A * | 8/1999 | Segan et al. | ............. | 327/24 |
| 6,710,605 B2 * | 3/2004 | Tang et al. | ............. | 324/614 |
| 7,615,966 B2 * | 11/2009 | Houldsworth et al. | ............. | 320/132 |
| 7,663,342 B2 * | 2/2010 | Kimball et al. | ............. | 320/132 |
| 8,115,453 B2 * | 2/2012 | Houldsworth et al. | ............. | 320/132 |
| 2001/0031026 A1 * | 10/2001 | Kohl et al. | ............. | 375/354 |

(Continued)

FOREIGN PATENT DOCUMENTS

JP    56082978 A  *  7/1981

OTHER PUBLICATIONS

"EPC Radio-Frequency Identify Protocols Class-I Generation-2 UHF RFID Protocol for Communications at 860 MHz-960 MHz", Version 1.0.9, Jan. 2005, pp. 1-94.*

(Continued)

*Primary Examiner* — George Bugg
*Assistant Examiner* — Paul Obiniyi
(74) *Attorney, Agent, or Firm* — William B. Kempler; Wade J. Brady, III; Frederick J. Telecky, Jr.

(57) ABSTRACT

A method of detecting a signal in radio frequency identification (RFID) transponder (FIG. 1) is disclosed. The method includes receiving a signal (FIG. 7) having a first time in a first logic state (high) and having a second time in a second logic state (low). A weight (700, 702) is determined in response to the first time and the second time. An output signal (from A2D) is produced in response to the weight and one of the first and second logic states.

8 Claims, 13 Drawing Sheets

U.S. PATENT DOCUMENTS

| | | | |
|---|---|---|---|
| 2004/0190913 A1* | 9/2004 | Seo et al. | 398/202 |
| 2005/0111537 A1* | 5/2005 | Sunter et al. | 375/226 |
| 2005/0226017 A1* | 10/2005 | Kotsopoulos et al. | 363/125 |
| 2006/0170479 A1* | 8/2006 | Hirata et al. | 327/295 |
| 2007/0143080 A1* | 6/2007 | Yancey | 702/189 |
| 2008/0079542 A1* | 4/2008 | Rofougaran | 340/10.1 |
| 2008/0278293 A1* | 11/2008 | Drucker | 340/10.4 |
| 2008/0290906 A1* | 11/2008 | Chou et al. | 327/77 |
| 2010/0135430 A1* | 6/2010 | Oh et al. | 375/295 |
| 2010/0271067 A1* | 10/2010 | Cauli et al. | 326/22 |

OTHER PUBLICATIONS

Curty et al., 2005, Remotely powered addressable UHF RFID integrated system IEEE.*

Karthaus et al., "Fully Integrated Passive UHF RFID Transponder IC with 16.7 µW Minimum RF Input Power," IEEE Journal of Solid State Circuits, vol. 38, No. 10, pp. 1602-1608 (Oct. 2003).

Curty et al., "Remotely Powered Addressable UHF RFID Integrated System," IEEE Journal of Solid State Circuits, vol. 40, No. 11, pp. 2193-2202 (Nov. 2005).

Zhu, "RFID Analog Front End Design Tutorial," Univ. of Adelaide (Jan. 2004).

"EPC Radio-Frequency Identify Protocols Class-1 Generation-2 UHF RFID Protocol for Communications at 860 MHz-960 MHz", Version 1.0.9, Jan. 2005, pp. 1-94.

A 110 nA Voltage Regulator System With Dynamic Bandwidth Boosting for RFID Systems; Balachandran, Ganish K. and Barnett, Raymond E.; IEEE Journal of Solid-State Circuits, vol. 41, No. 9, Sep. 2006; pp. 2019-2006.

* cited by examiner

DATA DETECTOR FOR UHF RFID TAGS

BACKGROUND OF THE INVENTION

The present embodiments relate to radio frequency identification (RFID) circuitry and, more particularly, to an ultra-low power, high dynamic range data detector for a UHF RFID circuit.

Radio frequency identification (RFID) circuits or transponders are prevalent in business, personal, and other applications, and as a result the technology for such devices continues to advance in various areas. Numerous applications for RFID circuits include automatic vehicle identification (AVI) for toll booth systems, smart card systems, book identification for libraries, pet identification systems, and inventory control. All of these systems include an interrogator and an RFID transponder. The interrogator must activate the transponder within a certain range, interrogate the transponder for specific information, and acknowledge receipt of the information. There are several advantages of the RFID circuit. First, it does not require an optical link. Thus, it can be implanted for pet identification or in a person to provide medical information. Second, it is typically powered by a received continuous wave (CW) signal from the interrogator and is, therefore, virtually maintenance free. Finally, the RFID transponder preferably communicates with the interrogator by backscattering. The transponder operates in resonance with the interrogator, modulates the original CW transmission, and sends it back to the interrogator. Thus, the RFID transponder emits no radio frequency signals until it is within range of a corresponding interrogator. A detailed specification of such an RFID system is described at "EPC™ Radio-Frequency Identity Protocols, Class-1 Generation-2 UHF RFID," Version 1.0.9, January 2005, and incorporated herein by reference in its entirety.

There are three major problems associated with existing data detector schemes. The first and most common problem is poor large RF signal handling capability. Referring to FIG. 9, there is an exemplary Schottkey full wave rectifier circuit of the prior art. The full wave rectifier circuit rectifies an RF input signal having −Vp to +Vp voltage excursion. The rectified voltage is then converted to a digital signal by a data slicer. The data slicer is typically a latched comparator that derives its power from the rectified supply voltage Vdd. Hence, it can only handle RF signals within a certain range. To give representative numbers, if the Vdd is 1.35V, then a large RF signal of value 1.8V peak at the RFID transponder input can result in a voltage as high as 3V at the input of the data slicer. This is more than twice the supply voltage and is too much for it to handle. The reason for a value as high as 3V is that the rectifier stage behaves like a voltage doubler. For example, at −Vp, diode 902 charges capacitor 900 to Vp-Vd as shown. Then at +Vp, diode 906 charges capacitor 908 to Vp-Vd. At −Vp of the next cycle, diode 902 again charges capacitor 900 to Vp-Vd. But on the following Vp, diode 906 charges capacitor 908 to 2(Vp-Vd) as shown.

A second problem with data detectors of the prior art is a difficulty interpreting small RF signals. Referring to FIG. 10, there is a simplified schematic diagram of a data slicer circuit of the prior art. Antenna 1000 receives a modulated RF input signal. RF clamp 1006 limits the peak-to-peak voltage excursion of the RF input signal to avoid damage to internal circuits. Multi-stage rectifier 1002 rectifies the RF signal. The rectified RF signal is regulated by voltage regulator 1004 to produce a nominal supply voltage Vdd of 1.35V. The RF input signal is also applied to single stage rectifier 1008 in the data path. The rectifier output produces an envelope difference voltage 1016 across resistor 1012 at the inputs of comparator 1014. The problem here is in the way the data slicing is traditionally done. Since the data information is contained in the signal envelope 1016, the signal envelope is compared with the average 1018 over several cycles to determine whether the data is a data-1 or a data-0. Ideally, the desired average would be half way between the maximum and minimum values of the signal envelope. Then the differential voltage across the inputs of comparator 1014 is symmetric. For example, the differential input might be +0.1V for a data-1 and −0.1V for a data-0. However, this is not usually the case as illustrated at FIG. 11. A maximum value of the signal envelope has the lowest value when the RF signal is minimum (Vp is minimum) and the diode drop is maximum (−40 deg C. and worst corner for diode). Under these circumstances the signal envelope peak can have a value as low as 40 mV. Further, depending on the encoding scheme, the data-1 and the data-0 can look as shown in FIG. 11, with very little time when RF is absent. This encoding scheme is particularly suitable for low RF conditions, when the RF power transmitted is small and it is desirable to have RF energy available to the RFID transponder for a greater fraction of the time. Under such a situation, when the data consists of a large number of data-1s, the average gravitates close to the maximum value of the signal envelope and can have a value as high as 35 mV. The difference between the envelope and the average is what the data slicer resolves to determine if it is a data-1 or data-0. This value can then be 5 mV and it can often be smaller than the comparator offset. Of course, this produces a wrong detection for a data-1.

Finally, the third major problem with data detectors of the prior art is large power consumption. Data detectors of the prior art typically use a comparator with buffered output 1216 as shown at FIG. 12. The output 1216 is typically latched by a D-flip flop (not shown). The comparator includes N-channel input transistors 1200 and 1202 and P-Channel current mirror transistors 1204 and 1206. The comparator further includes start up circuit 1208 and output transistors 1212 and 1214. Tail current through the comparator is determined by N-channel transistor 1210. In operation, a difference voltage at N-channel input transistors 1200 and 1202 produces a comparator output voltage at node A. The slew rate at node A must be sufficient to present a correct digital signal at the D-flip flop input prior to latch activation. Frequently, the desired slew rate at node A, therefore, requires relatively high comparator tail current and large power consumption.

In view of the preceding problems, the present inventors recognize that further improvements may be made by addressing some of the drawbacks of the prior art. In particular, there is a need to improve data detection over all operating conditions without excessive power consumption of the RFID transponder. Accordingly, the preferred embodiments described below are directed toward these benefits as well as improving upon the prior art.

BRIEF SUMMARY OF THE INVENTION

In a preferred embodiment of the present invention, a method of detecting a signal in a radio frequency identification (RFID) transponder is disclosed. The method includes receiving a signal having a first time in a first logic state and having a second time in a second logic state. A weight is determined in response to the first time and the second time. An output signal is produced in response to the weight and one of the first and second logic states.

DETAILED DESCRIPTION OF THE INVENTION

Figure 1:
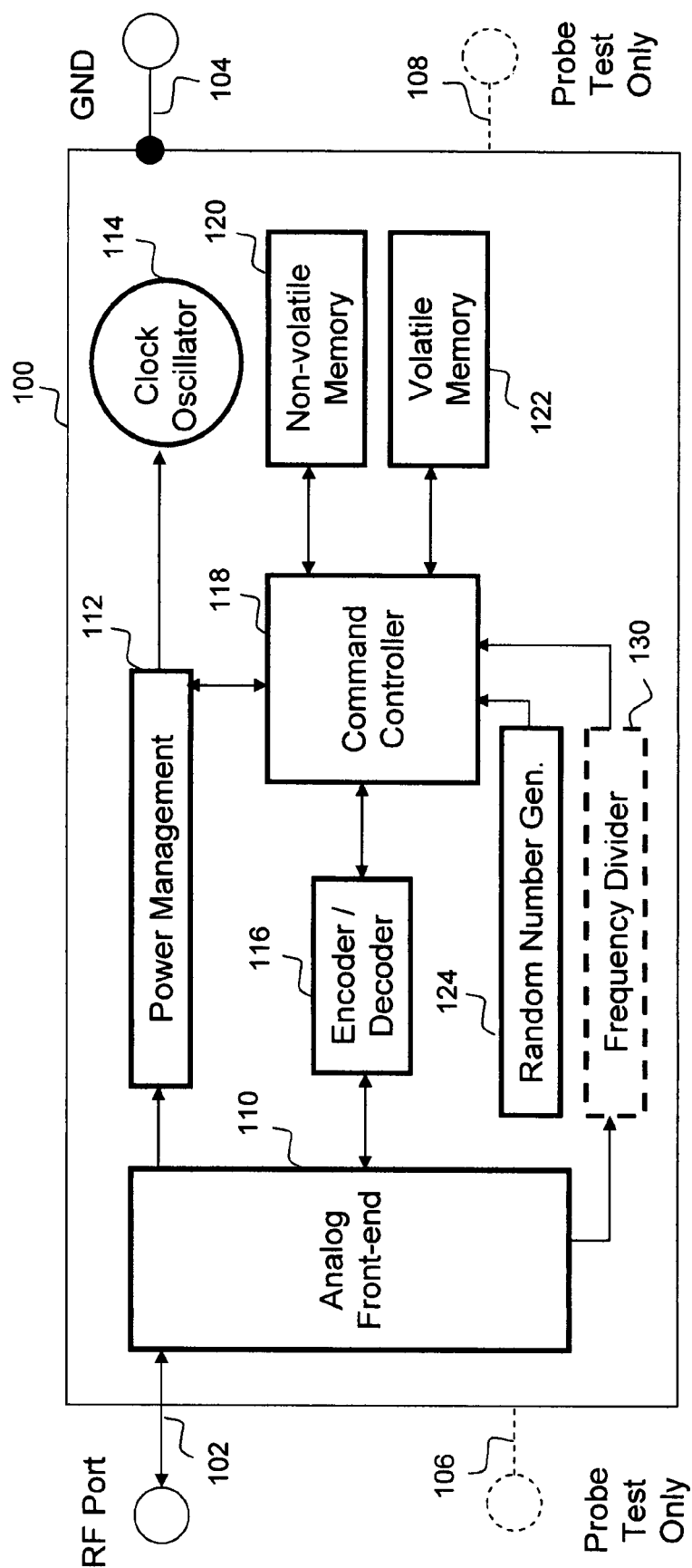
FIG. 1 is a block diagram of a RFID transponder of the present invention.

The preferred embodiments of the present invention provide significant advantages over radio frequency identification (RFID) transponders of the prior art. Referring to FIG. 1, there is a block diagram of an RFID transponder 100 of the present invention. The RFID transponder is a microprocessor with an analog front end 110. The microprocessor includes power management block 112. The power management block 112 rectifies the CW signal to power the microprocessor and drives clock oscillator circuit 114 to time various circuit operations. The power management block typically requires 3-4 ms to achieve power up. A frequency divider circuit 130 divides down a received UHF CW signal for synchronous operation of command controller 118. Encoder/decoder circuit 116 encodes and decodes messages between command controller 118 and an external interrogator. The command controller 118 stores commands, an electronic product code, and passwords in non-volatile memory 120 and uses volatile memory 122 as a work space memory. Random number generator 124 generates a unique random number for the command controller 118 at each power up event to distinguish it from other RFID transponders having the same electronic product code. This is preferably a 32-bit random number from two concatenated 16-bit random numbers.

The RFID transponder 100 includes external probe test ports 106 and 108 as well as external RF port 102 and ground (GND) terminal 104. In operation, ports 106 and 108 and GND 104 are preferably used to initially program the non-volatile memory 120 of the RFID transponder for a particular application. These probe test ports 106, 108 are preferably only available prior to encapsulation of the RFID transponder. Alternatively, the non-volatile memory 120 of the RFID transponder may be field programmed for a particular application by control commands received via the RF port 102 and GND 104. In operation, the RFID transponder receives modulated interrogator CW signals at an antenna connected between RF port 102 and GND 104 as will be discussed in detail. In the following discussion it should be understood that such an antenna is part of a resonant circuit may be a simple dipole, an inductor, or a combination of the two. The antenna may be integrated in the RFID transponder analog front end 110, fabricated in the transponder encapsulation material, or otherwise externally connected between RF port 102 and GND 104. A capacitor forms another part of the resonant circuit for the RFID transponder. As with the antenna, the capacitor may be integrated in the RFID transponder analog front end 110, fabricated in the transponder encapsulation material, or otherwise externally connected between RF port 102 and GND 104.

Figure 2:
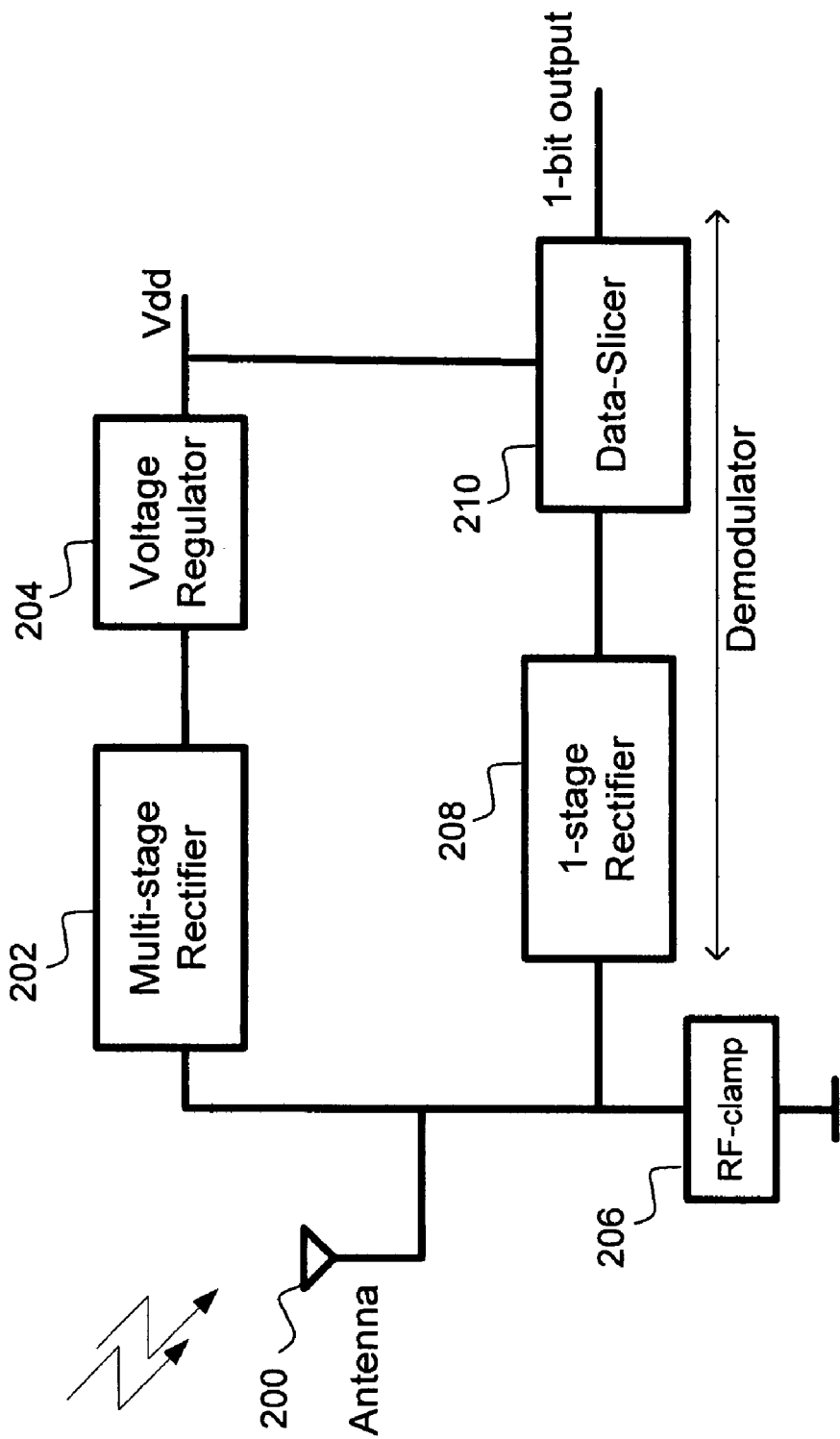
FIG. 2 is a simplified diagram showing a power path and a data path of the RFID transponder of FIG. 1.

FIG. 2 is a block diagram of an ultra-high frequency (UHF) RFID front end according to the present invention. Unlike a cell-phone system, where the input RF signal contains only the data, the RFID system uses the input RF signal to derive the power as well as decipher the data. In the simplest means of communication, the presence of RF represents a high level signal and the absence or reduced level of RF represents a low level signal. Thus, there are two paths connected to the antenna 200. A power path derives the supply voltage, and a data path deciphers the data. The path to derive the supply voltage consists of a multi-stage rectifier 202 (ac to dc converter) to derive as high an input voltage from as small an RF signal as possible with practical limits being set by the input capacitance and resistance of the rectifier which are determined by the antenna for conjugate matching. Voltage regulator 204 filters and regulates the rectified RF to produce supply voltage Vdd. A detailed description of the power path is presented by Balachandran et al., "a 110 nA Voltage Regulator System With Dynamic Bandwidth Boosting for RFID Systems," IEEE Journal of Solid State Circuits," vol. 41, no. 9, pp. 2019-2028 (September 2006), and is incorporated by reference herein in its entirety. The data path of the RFID front end includes a single stage rectifier 208 and a data slicer 210, the function of which will be explained in detail. Peak voltage at the input of both the power path and the data path is limited by RF clamp 206 to avoid damage to the internal circuit.

Figure 3:
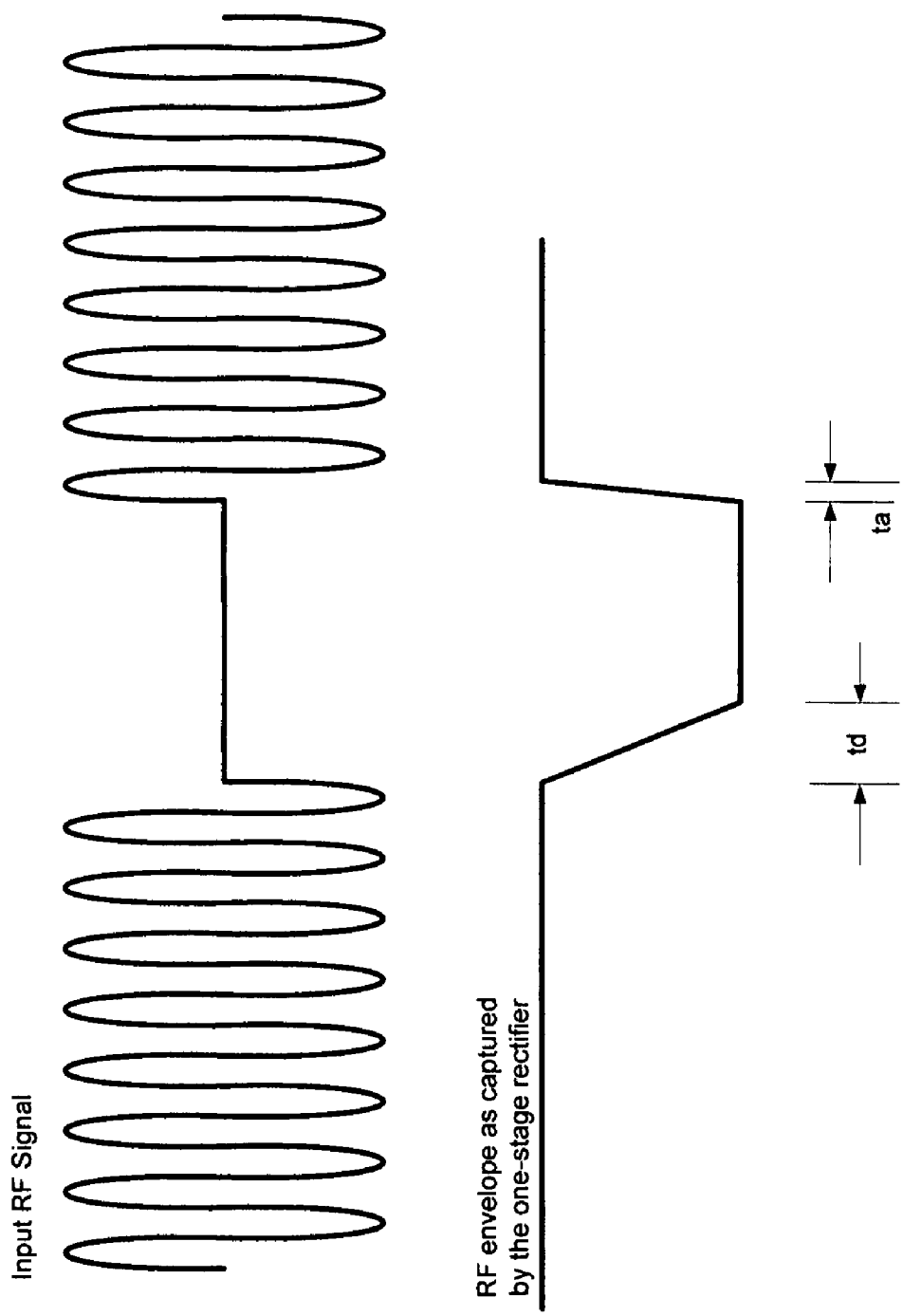
FIG. 3 is a diagram showing exemplary waveforms at the input and output of single stage rectifier 208 of FIG. 2.

Referring now to FIG. 3, there is a diagram showing exemplary waveforms at the input and output of single stage rectifier 208 of FIG. 2. The upper waveform is an RF sinusoid and may vary from 860 MHz to 960 MHz as determined by local radio regulations. The RF sinusoid is modulated by pulse-interval encoding (PIE) as shown. Thus, a presence of RF energy represents a logic high level, and an absence of RF energy indicates a logic low level. The single stage rectifier 208 produces the lower envelope waveform at its output. In the presence of RF energy, the high level envelope waveform is approximately twice the peak RF voltage as limited by RF clamp 206. Alternatively, in the absence of RF energy, the low level envelope is approximately at the reference supply voltage or ground. Transitions between the high and low levels (td and ta) are determined by the UHF RFID specification.

Figure 4A:
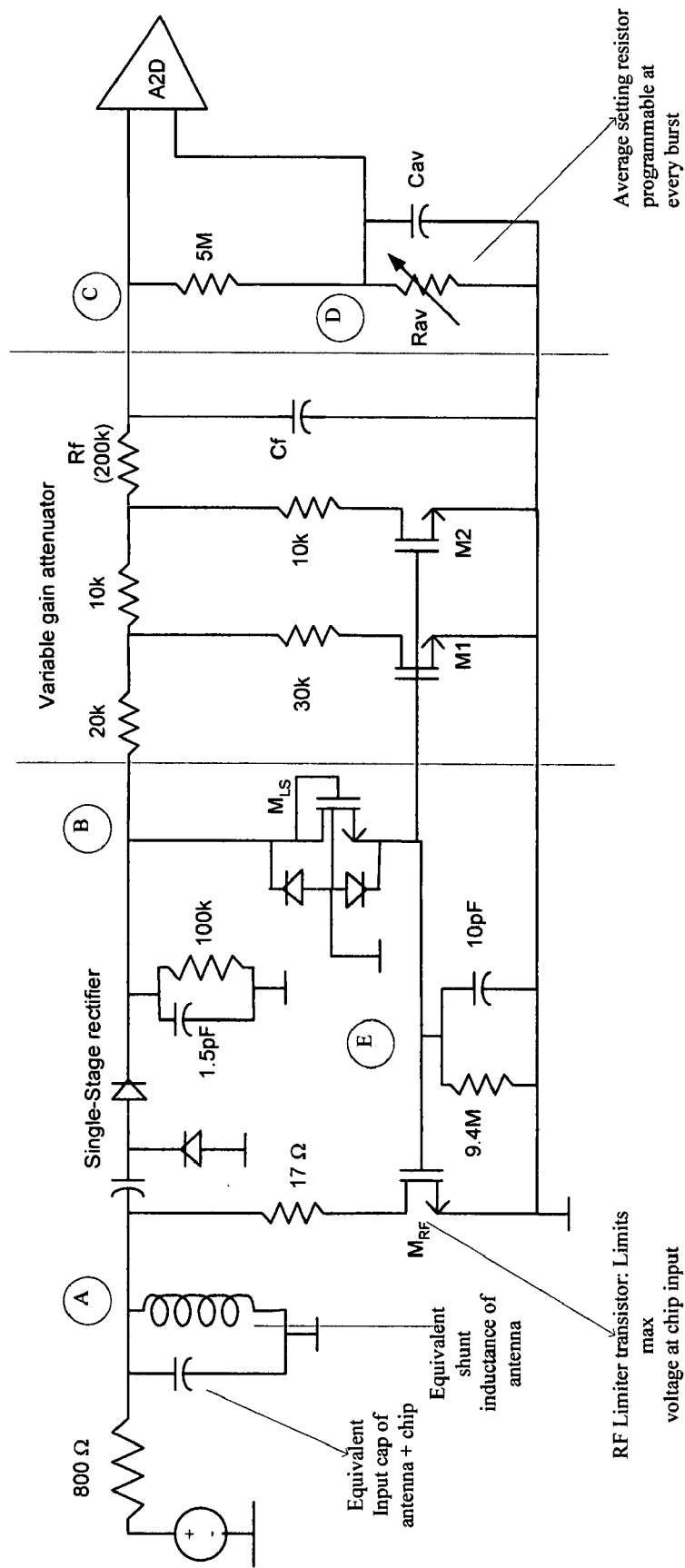
FIG. 4A is a schematic diagram showing the data path of the RFID transponder of FIG. 1.

Turning now to FIG. 4A, there is a schematic diagram showing the data path of the RFID transponder of FIG. 1. An RF interrogator at node A is represented as a Thevenin equivalent circuit having an 800 Ω impedance. A parallel LC circuit between node A and ground represents the transponder antenna inductance and circuit capacitance. A 17 Ω resistor and series transistor $M_{RF}$ clamp the maximum RF voltage seen by the internal circuit. Coupled between nodes A and B is a single stage rectifier 208 (FIG. 2). A 1.5 pF capacitor and 100 Ω resistor filter the rectified RF at node B. Transistor $M_{LS}$ is connected as a diode between node B and node E and in series with a 9.4 MΩ resistor and 10 pF capacitor. Together they form a bias circuit and produce a voltage signal at node E. This voltage signal is applied to the control gates of transistors $M_{RF}$, M1, and M2. A variable gain attenuator is connected between nodes B and C. A low pass filter formed by resistor Rf and capacitor Cf filters high frequency harmonics at node C. A 5 MΩ resistor is connected between nodes C and D, across the input terminals of data converter circuit A2D. The data converter circuit is also referred to as an analog-to-digital converter or a data slicer. Resistor Rav and capacitor Cav are connected between node D and ground to provide a programmable offset voltage for data converter A2D as will be explained in detail.

Operation of the variable gain attenuator circuit between nodes B and C will now be explained in detail. Recall that one of the major problems with data detector schemes of the prior art is an inability to handle large RF signals. This is particularly difficult for RFID transponders, which experience a wide variation in RF signal strength related to proximity to the interrogator. An ideal RF attenuator would remain in a high impedance state for low level RF signals and become gradually more conductive as RF signal strength exceeded a safe threshold. The variable gain attenuator of FIG. 4A advantageously operates in this manner. A filtered RF envelope at node B may vary in magnitude by more than 20% even with the RF clamp formed by the 17 Ω resistor and series transistor $M_{RF}$. This variation is due to the voltage doubling effect of the single stage rectifier, temperature and parameter variations, and a need to pass sufficient RF energy at low signal levels. The variable gain attenuator includes two parallel current paths to shunt excessive RF energy to ground. Additional current paths may be included for finer attenuation resolution as needed. A first current path is formed by a 30 KΩ resistor in series with transistor M1. A second current path is formed by a 10 KΩ resistor in series with transistor M2. At low RF signal levels, the bias circuit formed by transistor $M_{LS}$ in series with the parallel connected 9.4 MΩ resistor and 10 pF capacitor produces a low level voltage signal at node E. At this low level, transistors M1 and M2 conduct very little current. Thus, there is a very small voltage drop across the 30 KΩ and 10 KΩ series resistors and transistors M1 and M2 remain in saturation.

As the RF signal level at node B increases, the corresponding bias at node E also increases. Both transistors M1 and M2 become more conductive, but the corresponding voltage drop across the 30 KΩ resistor is much greater than the voltage drop across the 10 KΩ resistor. Transistor M1, therefore, enters a linear region of conduction while transistor M2 remains in saturation. This provides a first level of RF signal attenuation at node C. If the RF signal level at node B continues to increase, the bias at node E also increases and both transistors M1 and M2 enter the linear region. In this mode, both current paths through M1 and M2 shunt excess RF energy to ground so that the RF envelope at node C remains relatively constant. Alternatively, should the RF signal level decrease, both transistors M1 and M2 return to saturation mode and conduct very little current. In this mode, the RF signal level at node B and node C have substantially the same magnitude.

Recall that resistor Rav and capacitor Cav connected between node D and ground to provide a programmable offset voltage for data converter A2D. Operation of this circuit will now be explained in detail with reference to FIGS. 4B through 7. Referring first to FIG. 5, there are exemplary data-0 (top) and data-1 (bottom) pulse-interval encoded (PIE) waveforms. The RFID transponder must detect a wide range of waveforms as determined by specification. For example, the data-0 duration T0 may be from 6.25 µs to 25 µs. The data-i duration may be from 1.5 to 2 times T0. The RFID transponder acquires the actual duration of both data-0 and data-1 for each transaction from a preamble transmitted by the interrogator. The low period PW.T0 for both data-0 and data-1 waveforms is the same. However, the high level for data-i signals has a significantly larger duration (T1-PW.T0) than for the high level for data-0 signals (T0-PW.T0). An average signal envelope level, therefore, will be much lower for a series of data-0s than for a series of data-1s. This exacerbates low level RF signal detection as previously discussed. It is because a difference voltage at data detector A2D is the voltage between node C and node D. The voltage at node C is the rectified and filtered RF signal envelope. The voltage at node D, however, is the envelope average over several cycles.

Figure 7:
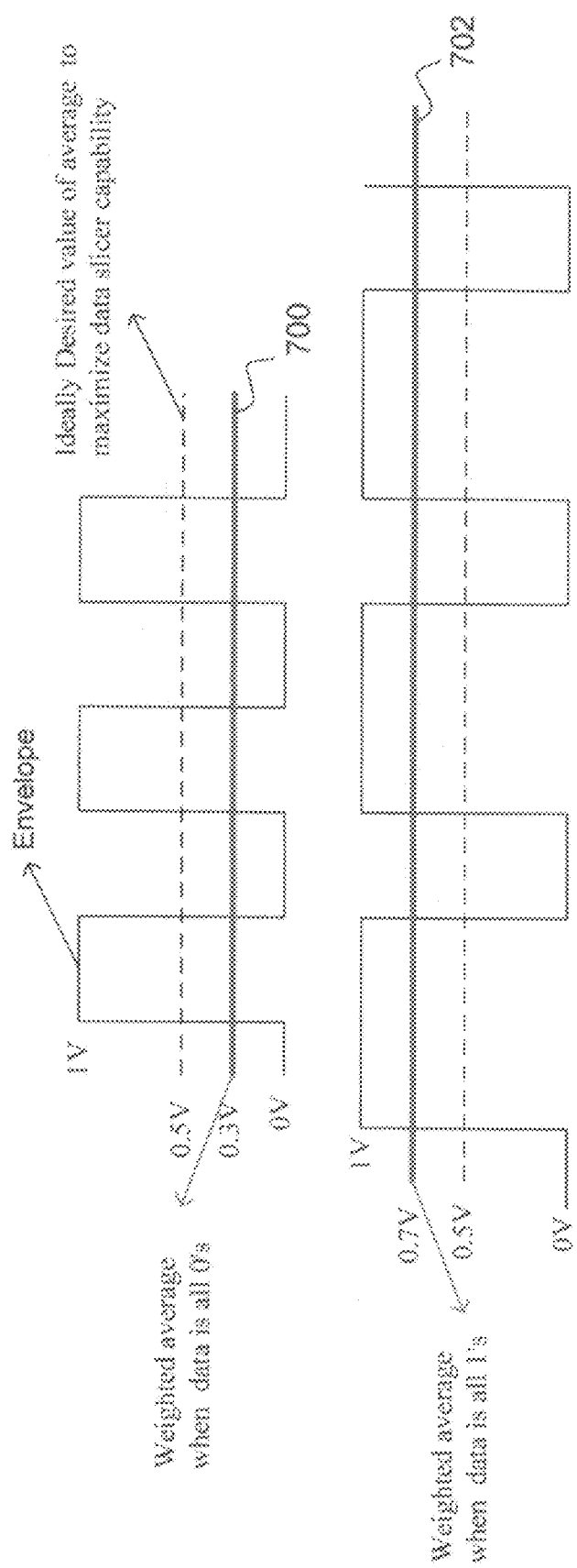
FIG. 7 is a waveform diagram showing different weighted averages for data-0 and data-1.

Turning now to FIG. 7, there is a waveform diagram showing different weighted averages for data-0 and data-1 according to the present invention. The upper waveform represents a series of data-0s having approximately equal high and low level duration. By way of comparison, the lower waveform represents a series of data-1s having much greater high level duration than low level duration. An ideal envelope average for both waveforms is a mid-range voltage represented by the dashed lines. The actual envelope average for the series of data-0s is shown by bold line 700. Likewise, the corresponding actual envelope average for the series of data-1s is shown by bold line 702. According to a preferred embodiment of the present invention, therefore, resistor Rav (FIG. 4A) is programmed to shift the actual envelope average (700, 702) back to a near ideal mid-level voltage represented by the dashed line.

Figure 6:
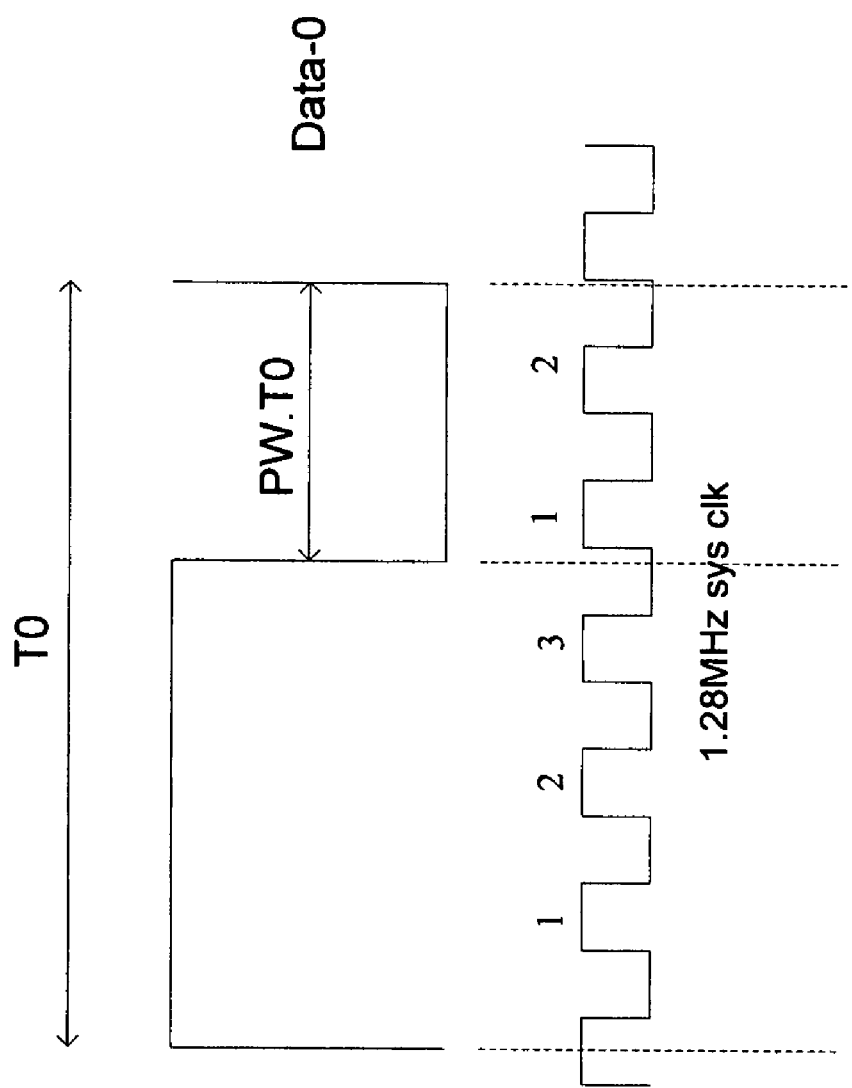
FIG. 6 is a waveform showing data-0 pulse duration measurement.

Referring now to FIG. 6, there is a waveform showing data-0 pulse duration measurement. Clock oscillator 114 (FIG. 1) produces a 1.28 MHz system clock to synchronize operation of the RFID transponder. There are eight cycles of the 1.28 MHz system clock, therefore, even in a minimum 6.25 µs data-0 pulse as shown. Command controller 118 (FIG. 1) counts a number of 1.28 MHz clock cycles during each of the low and high levels of data-0 or data-1 and uses them to estimate a duty cycle of the envelope at node D. For example, the duty cycle of a data-0 pulse is a ratio of low duration to high duration and is between 0.2 and 0.5 according to specification. Here, a ratio of 0.2 means a data-0 pulse has a high level duration equal to 5 times the low level duration. A ratio of 0.5 means the high level duration is equal to the low level duration. The command controller 118 calculates this ratio and determines an appropriate weight for Rav. The control processor then issues a control word to program a value of Rav to shift a voltage at node D to a near ideal mid-level voltage.

Figure 4B:
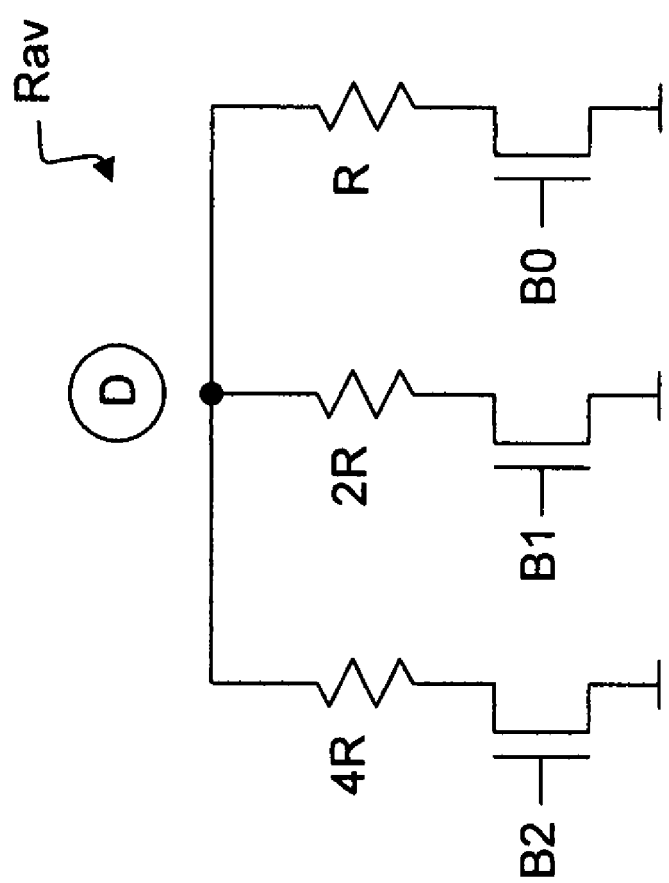
FIG. 4B is a schematic diagram of resistor Rav of FIG. 4A.
Figure 5:
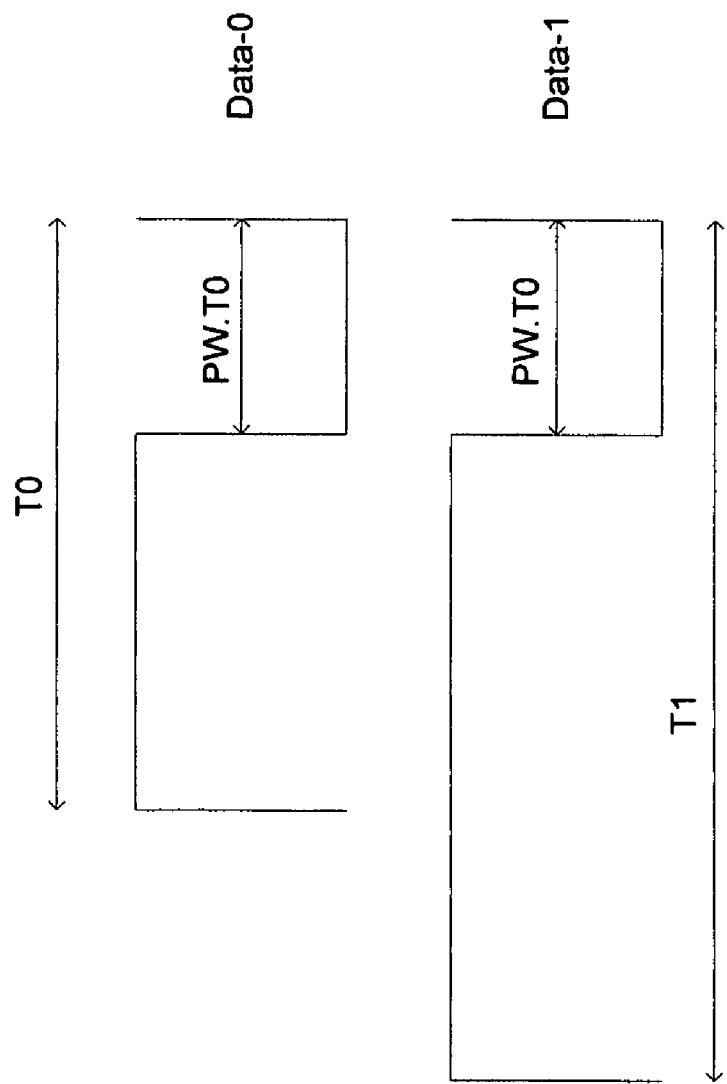
FIG. 5 is a waveform diagram of a data-0 and a data-1 envelope.

Turning now to FIG. 4B there is an exemplary circuit representing Rav (FIG. 4A). The circuit includes three parallel current paths between node D and ground. Each current path includes a transistor in series with a respective resistor. Each transistor receives a respective bit of the control word from the control processor. The resistors are preferably weighted with binary values. In operation, the transistors are selectively activated by respective bits of the control word so that Rav may vary from R to 7R in value. For example, a calculated duty cycle greater than 0.38 would indicate a large data-0 content corresponding to greater low level envelope duration. In this case, the value of Rav would increase, thereby decreasing the attenuation at node D and shifting voltage level 700 (FIG. 7) up to the ideal reference voltage level represented by the dashed line. Alternatively, for a calculated duty cycle less than 0.25 would indicate a large data-1 content corresponding to greater high level envelope duration. In this case, the value of Rav would decrease, thereby increasing the attenuation at node D and shifting voltage level 702 (FIG. 7) down to the ideal reference voltage level represented by the dashed line. For either case, therefore, the present invention advantageously maximizes the difference voltage at input terminals (nodes C and D) of the data converter A2D, thereby improving low level RF signal detection.

Figure 8:
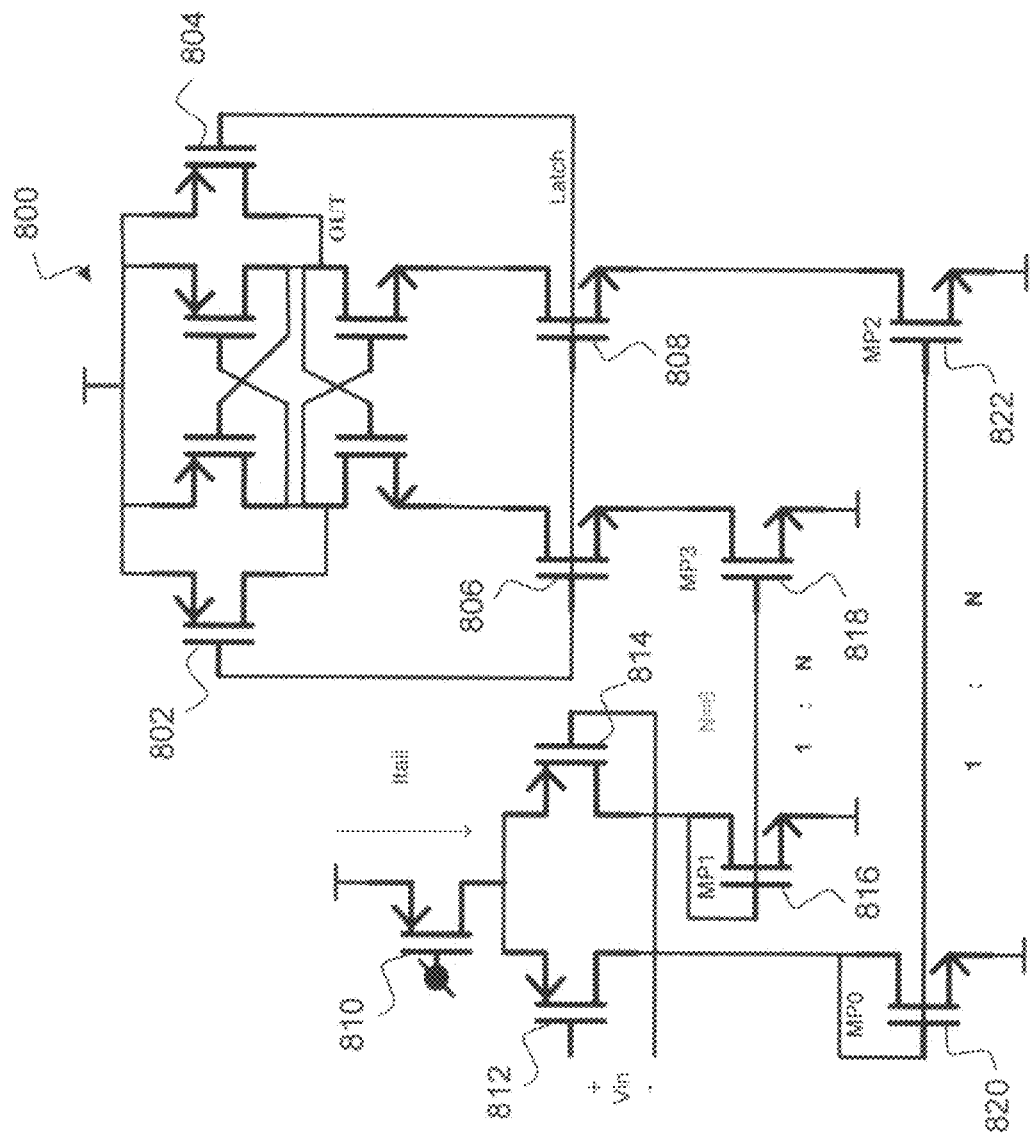
FIG. 8 is a circuit diagram of a preamplifier and dynamic latch of the present invention.
Figure 9:
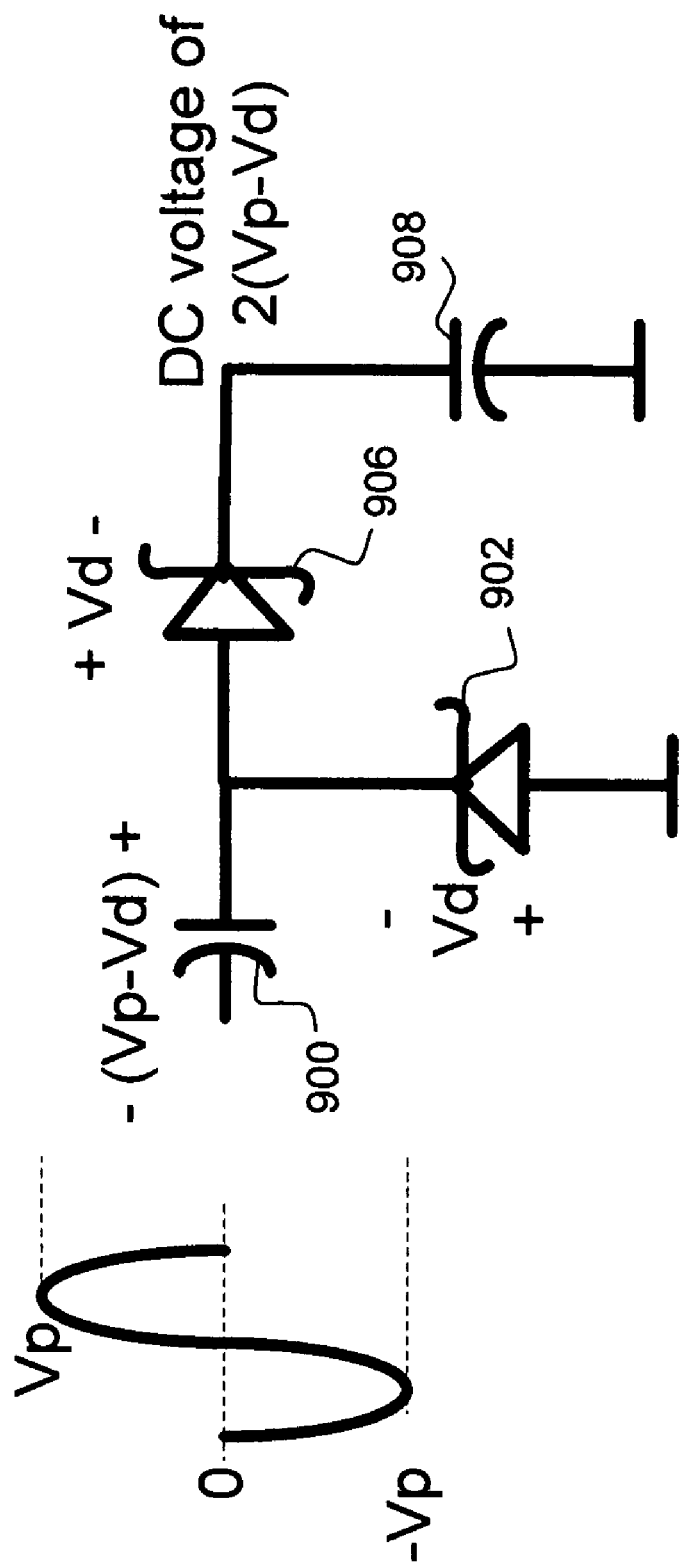
FIG. 9 is an exemplary Schottky full wave rectifier of the prior art.
Figure 10:
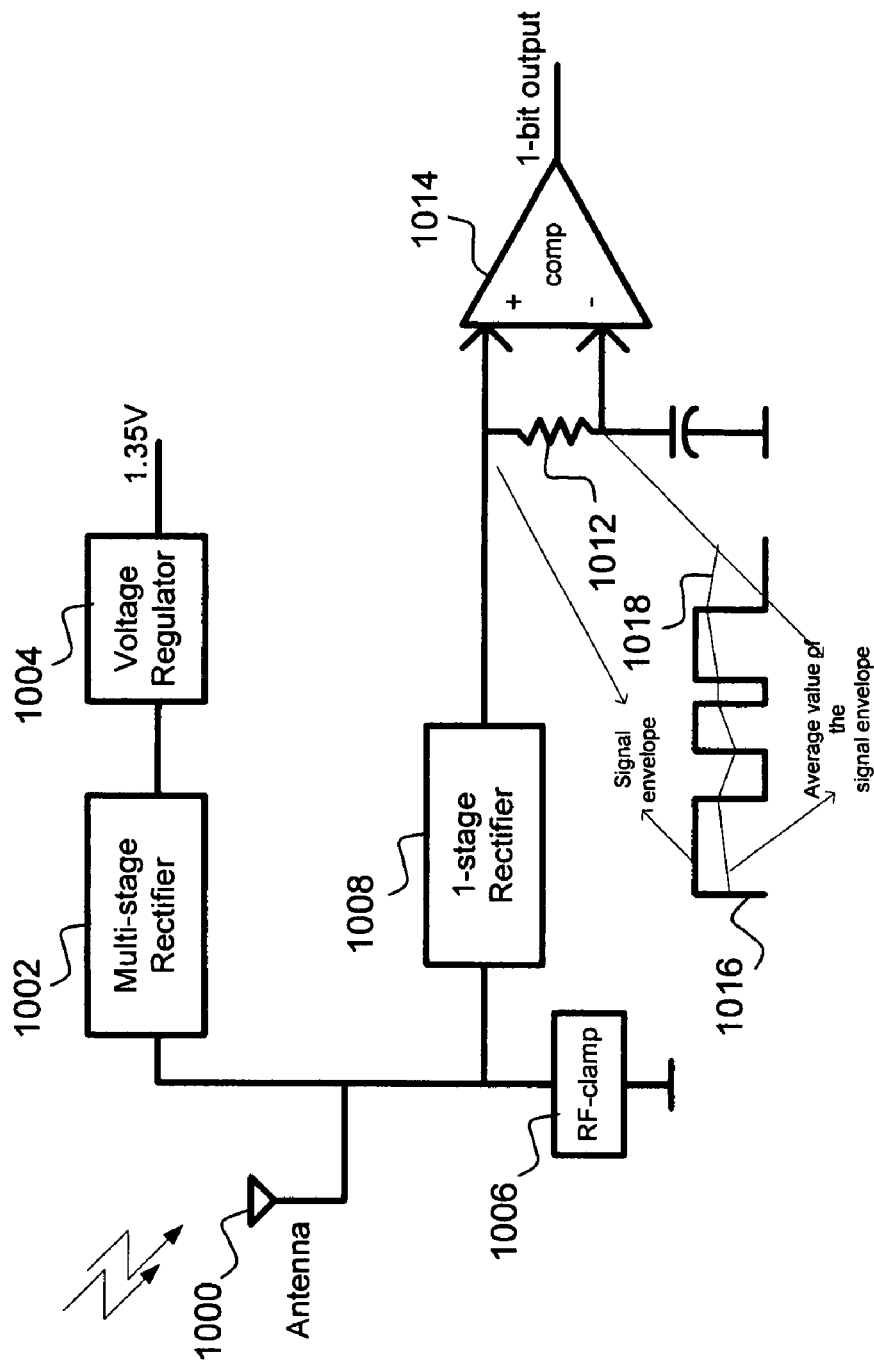
FIG. 10 is a simplified schematic diagram of a data slicer of the prior art.
Figure 11:
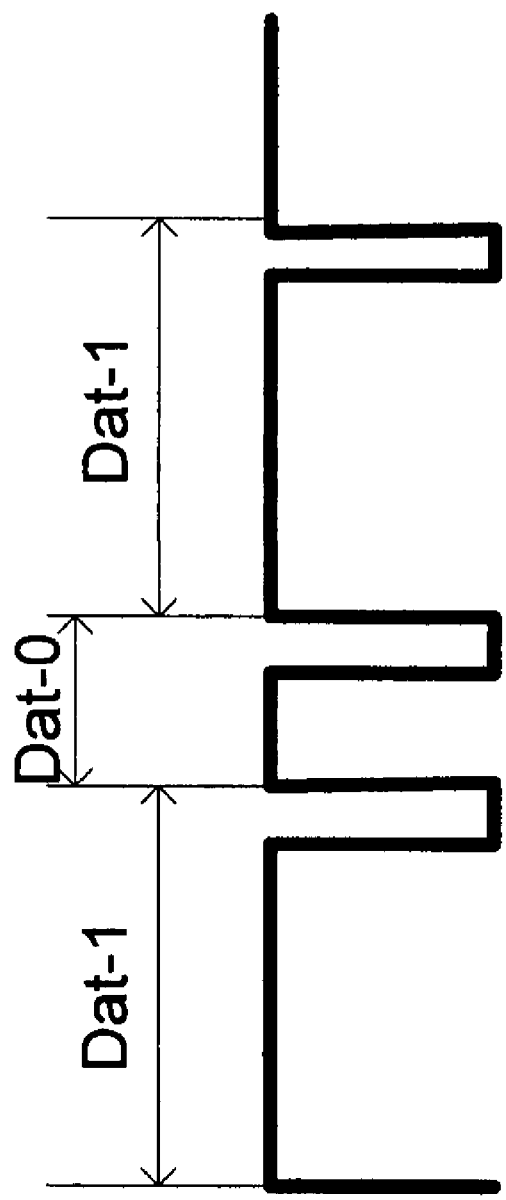
FIG. 11 is a n illustration of non-symmetric data known in the prior art.
Figure 12:
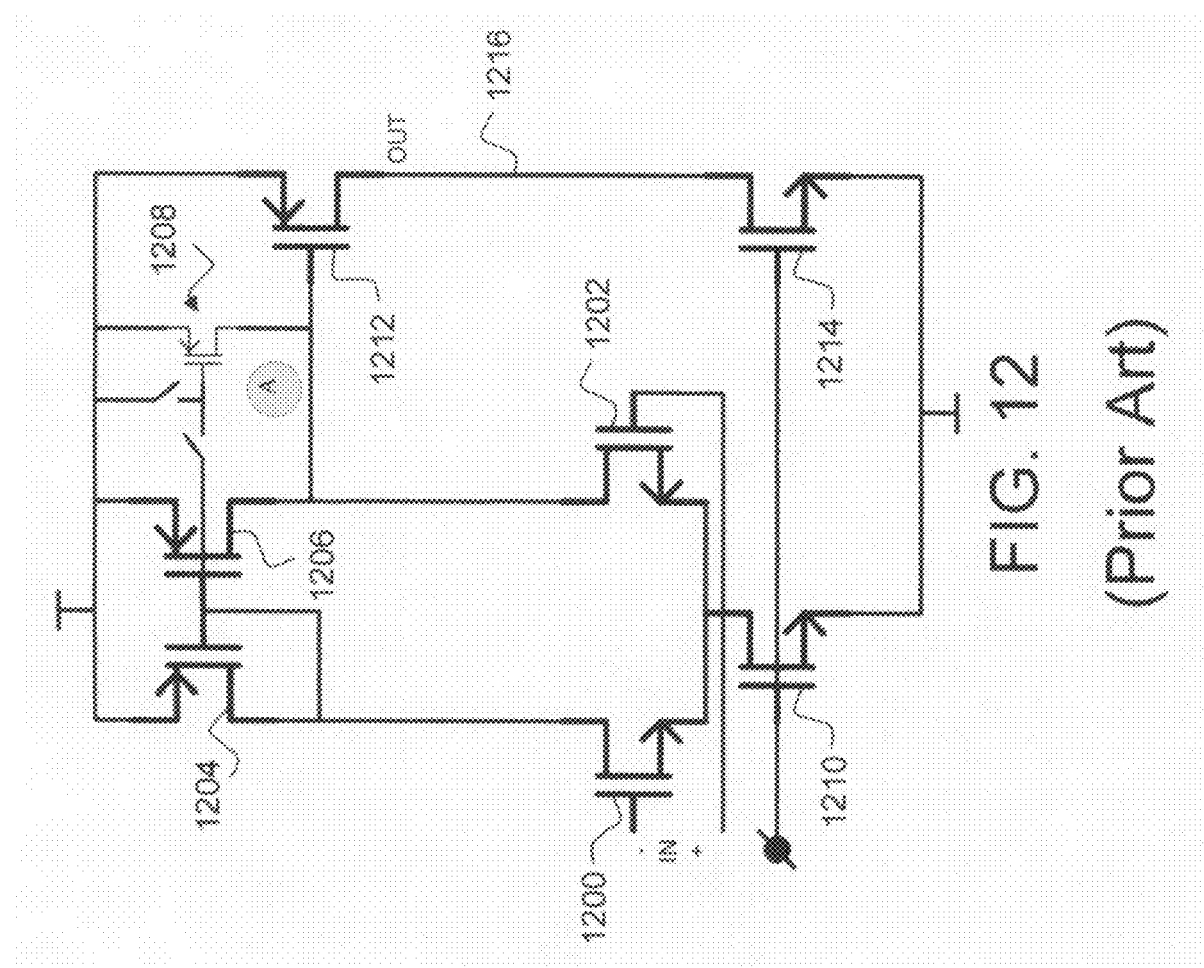
FIG. 12 is a schematic of a comparator with buffered output known in the prior art.

Referring now to FIG. 8, there is a schematic diagram of a data detector A2D (FIG. 4A) of the present invention. The data detector includes a preamplifier and a dynamic latch. The preamplifier gain advantageously suppresses the offset of the dynamic latch. The preamplifier includes current source transistor 810, input transistors 812 and 814, and output transistors 820 and 816. The dynamic latch includes input transistors 818 and 822 coupled in series with switching transistors 806 and 808, respectively. The switching transistors 806 and 808 couple input transistors 818 and 822 to cross-coupled latch 800 in response to a high level of signal Latch. Precharge transistors 802 and 804 precharge the output terminals of latch 800 to a high level in response to a low level of signal Latch. In operation, current source transistor 810 advantageously produces a relatively small tail current (Itail) compared to data detectors of the prior art (FIG. 12). Operating speed of the data detector is maintained, however, because the preamplifier operates together with the dynamic latch. A difference voltage between node C and D (FIG. 4A) is applied to the control gates of input transistors 812 and 814. The input transistors differentially steer tail current (Itail) to their respective output transistors 820 and 816 in response to the difference voltage and produce an amplified difference voltage at the control gates of input transistors 818 and 822. When this difference voltage is established, switching transistors 806 and 808 are enabled by a low-to-high transition of signal Latch. A differential current through the switching transistors 806 and 808 and input transistors 818 and 822 sets latch 800. The resulting data output is applied to decoder 116 (FIG. 1).

The foregoing embodiments of the present invention provide significant improvement over data detectors of the prior art. Large RF signal level detection is improved by a novel variable gain attenuator. Small RF signal level detection is also improved by a novel weighted offset provided by programmable variable resistance. Power consumption is advantageously decreased by a novel combination of a preamplifier with a dynamic latch.

Still further, while numerous examples have thus been provided, one skilled in the art should recognize that various modifications, substitutions, or alterations may be made to the described embodiments while still falling with the inventive scope as defined by the following claims. For example, embodiments of the present invention may be applied to virtually any item. Other combinations will be readily apparent to one of ordinary skill in the art having access to the instant specification.

What is claimed is:

1. In an RFID circuit for receiving a modulated RF signal having an envelope corresponding to digital coding of information, a method of detecting the signal, comprising:
   receiving a signal having a signal strength dependent on distance from an interrogator including a preamble and having a first time in a first logic state and having a second time in a second logic state;
   dynamically determining a weighted average voltage from the preamble in response to the first time and the second time, the weighted average voltage being between voltages representing the first logic state and the second logic state and being determined by the relative number of the first and second logic states in the preamble;
   generating a voltage representative of the envelope;
   controlling a value of the envelope voltage utilizing the weighted average voltage from the preamble to generate a value closer to or equal to an ideal comparison voltage; and
   comparing the comparison voltage to the received signal to produce an output signal in response to one of the first and second logic states.

2. A method as in claim 1, wherein the step of receiving comprises:
   receiving a pulse-interval encoded signal; and
   rectifying the pulse-interval encoded signal.

3. A method as in claim 2, wherein the step of receiving comprises limiting the signal after the step of rectifying.

4. A method as in claim 1, wherein the step of determining comprises estimating a duty cycle of the signal.

5. A method as in claim 1, wherein the step of determining comprises counting a number of clock cycles during each of the first and second times.

6. A method as in claim 1, wherein the weight determines an input offset for a data comparator.

7. A method as in claim 1, wherein the weight determines an input offset for a data slicer.

8. The method of claim 1 wherein the ideal comparison voltage is midway between the envelope signal levels.

* * * * *